United States Patent
Sullivan

[11] Patent Number: 6,077,619
[45] Date of Patent: Jun. 20, 2000

[54] POLYCRYSTALLINE SILICON CARBIDE CERAMIC WAFER AND SUBSTRATE

[76] Inventor: Thomas M. Sullivan, 2655 Rand Rd., Indianapolis, Ind. 46241

[21] Appl. No.: 09/063,405

[22] Filed: Apr. 21, 1998

Related U.S. Application Data

[63] Continuation-in-part of application No. 08/624,824, Mar. 27, 1996, Pat. No. 5,850,329, which is a continuation-in-part of application No. 08/332,419, Oct. 31, 1994, Pat. No. 5,623,386.

[51] Int. Cl.$^7$ .................................................. G11B 5/82
[52] U.S. Cl. ...................... 428/698; 428/141; 428/156; 428/457; 428/469; 428/472; 428/697; 428/699; 428/692; 428/693; 428/701; 428/702
[58] Field of Search ................................. 428/698, 472, 428/446, 212, 141, 156, 457, 469, 701, 702, 697, 699, 692, 693

[56] References Cited

U.S. PATENT DOCUMENTS

| | | |
|---|---|---|
| 3,681,225 | 8/1972 | Susumu Genma et al. . |
| 3,704,211 | 11/1972 | Phillips . |
| 4,069,360 | 1/1978 | Yanagisawa et al. . |
| 4,239,819 | 12/1980 | Holzl . |
| 4,376,963 | 3/1983 | Knoop et al. . |
| 4,598,017 | 7/1986 | Bayer et al. . |
| 4,637,963 | 1/1987 | Nishimatsu et al. . |
| 4,866,005 | 9/1989 | Davis et al. . |
| 4,875,083 | 10/1989 | Palmour ................................. 357/23.6 |
| 4,912,063 | 3/1990 | Davis et al. . |
| 4,947,218 | 8/1990 | Edmond et al. ........................... 357/13 |
| 4,961,913 | 10/1990 | Sullivan . |
| 5,200,022 | 4/1993 | Kong et al. . |
| 5,243,204 | 9/1993 | Suzuki et al. .............................. 257/77 |
| 5,356,522 | 10/1994 | Lal et al. . |
| 5,374,412 | 12/1994 | Pickering et al. . |
| 5,432,808 | 7/1995 | Hatano et al. ............................. 257/77 |
| 5,463,978 | 11/1995 | Larkin et al. ............................. 117/89 |
| 5,465,184 | 11/1995 | Pickering et al. . |
| 5,465,249 | 11/1995 | Cooper, Jr. et al. ..................... 365/149 |
| 5,585,648 | 12/1996 | Tischler .................................... 257/77 |
| 5,623,386 | 4/1997 | Sullivan . |
| 5,625,202 | 4/1997 | Chai ......................................... 257/94 |
| 5,723,376 | 3/1998 | Takeuchi et al. ........................ 438/270 |
| 5,750,434 | 5/1998 | Urushidani et al. ..................... 438/478 |
| 5,766,343 | 6/1998 | Dmitriev et al. ......................... 117/88 |
| 5,850,329 | 12/1998 | Sullivan .................................. 360/135 |

FOREIGN PATENT DOCUMENTS 57-56309  4/1982  Japan .

OTHER PUBLICATIONS

Philip G. Neudeck, "Progress in Silicon Carbide Semiconductor Electronics Technology," Journal of Electronic Materials, vol. 24, No. 4, 1995.

Primary Examiner—Archene Turner
Attorney, Agent, or Firm—Clark & Brody

[57] ABSTRACT

A substrate made of polycrystalline βSiC and having an essentially pore free surface is disclosed. The substrate is adapted for use as a chip wafer to receive different thin film coatings as part of manufacturing electrical devices and integrated circuits. The substrate comprises a polycrystalline silicon carbide outer surface with {111} crystallographic planes exposed on the working surface, the outer surface is essentially pore free or without exposed pores, scratches, steps or other such depressions or discontinuities on the surface of the substrate having at least one dimension larger than about 2.54 microns, and no non-stoichiometric silicon or carbon other than that which may be residual from the process of making silicon carbide ceramic material.

10 Claims, 3 Drawing Sheets

7 — Lapped and Polished Non-Porous Coating
3 — Porous Disk

POLYCRYSTALLINE SILICON CARBIDE CERAMIC WAFER AND SUBSTRATE

This application is a continuation-in-part of Ser. No. 08/624,824 filed Mar. 27, 1996, now U.S. Pat. No. 5.850, 329, which is a continuation-in-part of Ser. No. 08/332,419, filed Oct. 31, 1994, now U.S. Pat. No. 5,623,386, both of which being incorporated by reference in their entirety herein.

FIELD OF THE INVENTION

This invention relates to substrates used to support circuit lines, transistors, capacitors, resistors and other components of electronic chips such as integrated chips and other similar electronic devices.

BACKGROUND ART

Silicon carbide has been an attractive potential material for use in electronic devices for many years. Because silicon carbide has no low temperature phase changes, a comparatively large energy bandgap, a high breakdown field strength, a high saturated electron drift velocity, and chemical resistance to most species commonly found in the environment of electronic device processing, silicon carbide has been an enticing, though largely unrealized candidate material for applications involving rigorous mechanical and thermal shock, as well as high operating temperatures, high power, high frequency, and intense radiation.

Many types of silicon carbide made by a variety of processes have been tried as candidate substrate materials. Previous efforts include the use of substrates made from the consolidation of finely divided ceramic powders (sintering), substrates made by various reactions of silicon metal, carbon, and other additives (sometimes referred to as the "Carborundum Process"), and substrates made by seeded sublimation (single crystal).

A silicon carbide ceramic monolith made by consolidation of finely divided particles, for example by "sintering," is too porous to support circuit lines measuring less than 0.25 microns wide. Though significant portions of the monolith may exhibit pores no larger than 1 or 2 microns, occasional larger pores measuring 75 microns across will occur which cannot be reduced in size or number by controlling the manufacturing process and therefore must be detected at great cost by measuring each part after the cost of manufacturing has been incurred.

Silicon carbide made by consolidating or reacting finely divided particles produces the wrong crystallographic form to support an electronic device. Usually hexagonal or rhombohedral or a combination thereof in crystal shape, commonly referred to as "alpha SiC", these crystals do not match the coefficient of thermal expansion of epilayers closely enough to avoid undesirable stacking faults bounded by partial dislocations. Device quality is limited. Researchers have shown, however, that by coating an alpha SiC wafer or substrate with a cubic "beta SiC" epilayer or by doping the alpha SiC substrate with aluminum, boron, nitrogen, or phosphorus species, the "crystal shape memory" imparted by the alpha SiC to a subsequent beta SiC epilayer can be blurred so device quality beta SiC is formed.

Large single crystal silicon carbide is made by a very slow, capital intensive process entailing the sublimation of silicon carbide onto a small single crystal seed. The process for large single crystal to date has been unable to produce the standard diameter wafers currently preferred by device manufacturers to minimize fabrication costs. U.S. Pat. No. 4,866,005, incorporated herein in its entirety by reference, describes one such method of growing large single crystals. The largest single crystal silicon carbide substrates commercially available measure only 50 mm diameter compared to the 200 mm or 300 mm diameter substrates normally used in industry. A 50 mm substrate has only 1,962.5 mm$^2$ of potentially useable surface area on one side compared to 31,400 mm$^2$ of potential surface area for a 200 mm substrate. Since it costs about the same for a device manufacturer to process a 200 mm wafer as to process a 50 mm wafer, devices made using a 200 mm wafer cost only 6.25 percent as much as devices made using 50 mm wafers. Because 50 mm substrates are only available in small quantities costing more than $2,000 per wafer, using a 200 mm substrate would represent significant savings to a device manufacturer even if the 200 mm substrate sold for $2,000.

Other issues arise from the use of large single crystal silicon carbide. Many of these issues are described by U.S. Pat. Nos. 4,912,063 and 5,200,022, incorporated entirely herein by reference. Single crystal silicon carbide is made at temperatures favoring the formation of the αSiC polytype. The "alpha" silicon carbide (αSiC) polytype is a collective reference to some 170 types of hexagonal and rhombohedral crystal shape classifications. The most common is the 6H hexagonal polytype. Most αSiC polytypes are separated by small thermodynamic differences that are difficult to control in a temperature dependent manufacturing process like that used to make large single crystals.

Beta SiC (βSiC) is the only cubic crystalline polytype. Theoretically an excellent semiconductor material, deposition of βSiC with oriented crystals (also referred to as epitaxy, epilayers, or "thin films") on various ceramic or silicon metal substrates has been attempted on various occasions over many years. The difficulty of producing consistently high quality, low carrier concentration βSiC epitaxial layers has prevented commercial exploitation.

In order to provide a hospitable surface on which to support an epitaxial βSiC layer, substrates are usually made from large αSiC single crystals by sawing the crystal into wafers along a [0001] surface plane, then lapping and polishing the wafers to a smooth surface. The {0001} crystallographic surface plane provides a surface that matches the Coefficient of Thermal Expansion (CTE) of the (111) surface of βSiC. Low defect βSiC epilayers have thus been applied to single crystal αSiC. The process of lapping and polishing single crystal αSiC substrates, however, typically cuts through a multitude of surfaces to expose surface features associated with higher surface energy than a broad, flat single surface. A surface intersecting multiple crystalline lattice is planes creates a series of physical "steps." Multiple steps transmit three dimensional lattice information to an epitaxial layer usually causing formation of a mixture of alpha and beta polyforms in the epitaxial layer, thereby making the subject layer unsuitable for high quality devices.

Silicon carbide substrates can be used to support magnetic media in hard disk drives (U.S. Pat. No. 5,623,386). The mechanical requirements for disk drive substrates rotating at up to 10,000 rotations per minute with heads gliding less than 0.025 microns above substrate surfaces surpass the mechanical requirements of chip substrates. Magnetic media needs a substrate without surface defects such as pits that cause "dead spots" in the media or surface features exposing different lattice planes that cause variations in the magnetic media, commonly referred to as "noise." The size of surface pits or defects on disk drive substrates which can be tolerated, however, is considerably larger than the size of surface defects which can be tolerated for high quality electronic devices like chips (approximately 2 microns for disk drive substrates versus 0.1 microns for a high quality integrated chip for example). Apart from the issue of exposing high energy lattice positions that might cause undesirable crystallographic forms, media used for disk drives is much thicker than thin film coatings used for chips and can more easily "bridge" surface defects. Magnetic media is also different from the thin films of electrical devices in the way it functions. Magnetic media does not require electrical continuity to function. Data bits in magnetic media are magnetic domains, the polarity of which determines whether an individual bit is either a 0 or a 1 binary code.

It has nevertheless been generally accepted that polycrystalline SiC monoliths will not support epitaxial SiC thin films of the purely beta polyform required for some high quality electrical devices.

SUMMARY OF THE INVENTION

It is the first object of the invention to reduce cost per unit of surface area for chip wafer substrates, to provide a substrate capable of increased chip areal density, to improve chip reliability at high operating temperature by means of significantly improved substrate thermal conductivity, and to substantially increase device speed by providing a substrate with a high dielectric strength at high frequency.

It is a further object of the present invention to utilize polycrystalline silicon carbide ceramic material comparable to the silicon carbide used to make disk drive substrates as a material of construction for less demanding chip wafer substrates and a new and improved version of the polycrystalline silicon carbide ceramic material used to make disk drive disk substrates to make high quality chip wafer substrates used to support conductive, semiconductive, dielectric and other layers used in the manufacture of integrated chips and other electrical devices well known to one skilled in the art.

The present invention also provides a more efficient utilization and conservation of energy resources by using and enabling ceramic materials as more efficient components of chips needed to control devices, equipment, and processes using large amounts of energy.

Other objects and advantages of the present invention will become apparent as a description thereof proceeds.

In satisfaction of the foregoing objects and advantages, the present invention is directed to a substrate for electronic devices and integrated devices thereof which is principally made of polycrystalline silicon carbide ceramic material. In its broadest embodiment, the invention comprises the substrate component singularly or in combination with subsequent thin film coatings so as to form a part or parts of an integrated chip.

The substrate of the present invention comprises at least one or more of the following: a substrate used to support an electrically conductive layer, a semiconductor layer, an electrically non-conductive or insulating layer, a resistive layer, or a ferroelectric layer. The substrate is useable at temperatures over 500° C. and has a single phase, highly oriented, polycrystalline beta silicon carbide ceramic outer surface without exposed pores, scratches, steps, or other such depressions or discontinuities in the surface of the substrate having at least one dimension larger than about 0.1 micron for high quality electronic devices or having at least one dimension larger than about 2.54 micron for less demanding electronic device applications. No non-stoichiometric silicon or carbon other than that which may be residual from the process of making the silicon carbide ceramic material is present in the substrate. The substrate is a monolithic substrate with a polycrystalline βSiC ceramic surface which may be used to support one or more layers, either similar or dissimilar, used in combination as an electrical device.

A monolithic substrate with a polycrystalline βSiC surface can be used to support one or more layers, one or more of which is a βSiC epitaxial layer. The layer of epitaxial βSiC adjacent to a monolithic βSiC substrate can be utilized 1) to heal small imperfections in the substrate surface, and 2) to provide a higher purity, more nearly perfect, semiconductive layer.

A monolithic substrate with a polycrystalline βSiC surface supporting one or more layers, can be used to support electrically conductive layers one or more of is which is comprised of aluminum metal, gold metal, copper metal, or silver metal. Metal layers can be used to connect features of an integrated chip, for example, such as transistors or groups of features, such as "tools," or Schottky rectifiers.

A monolithic substrate with a polycrystalline βSiC surface supporting one or more layers, can be used to support an epitaxial layer of βSiC which has been doped to form a p-type or an n-type semiconductor.

A monolithic substrate with a polycrystalline βSiC surface supporting one or more layers can be used to support an electrically insulative layer comprised of silica or silicon nitride. Conductive and semiconductive layers in electrical devices often need to be separated by insulative layers to control the flow of currents.

A monolithic substrate with a polycrystalline βSIC surface supporting one or more layers, can be used to support one or more capacitor material layers comprised of tantalum dioxide or a ferroelectric material such as barium ferrite or perovskite.

The inventive substrate can also be DATANITE (trademarked) made by Sullivan & Company of Indianapolis, Ind., the DATANITE substrate to receive the non-magnetic thin film coatings as used in electrical components. This application is particularly adapted for low grade wafer use since the pore sizes of DATANITE is generally less than 2.54 microns. DATANITE is the material described in the inventor's U.S. Pat. No. 5,623,386. The thin film coatings described herein are intended for use in electrical components and do not encompass magnetic material coatings adapted for uses in magnetic memory recording components.

The invention also entails a silicon carbide substrate comprising a top and bottom surface, the top surface having an exposed polycrystalline {111} crystallographic plane, the top surface without exposed pores, scratches, steps or other such depressions or discontinuities on the surface of the substrate having at least one dimension larger than 2.54 micron, preferably no larger than 0.1 micron and no non-stoichiometric silicon or carbon other than that which may be residual from the process of making silicon carbide ceramic material. In other words, the surface pore or equivalent depression with a maximum size of the largest dimension being 2.54 microns, preferably 0.1 microns.

DESCRIPTION OF THE PREFERRED EMBODIMENTS

Figure 1:
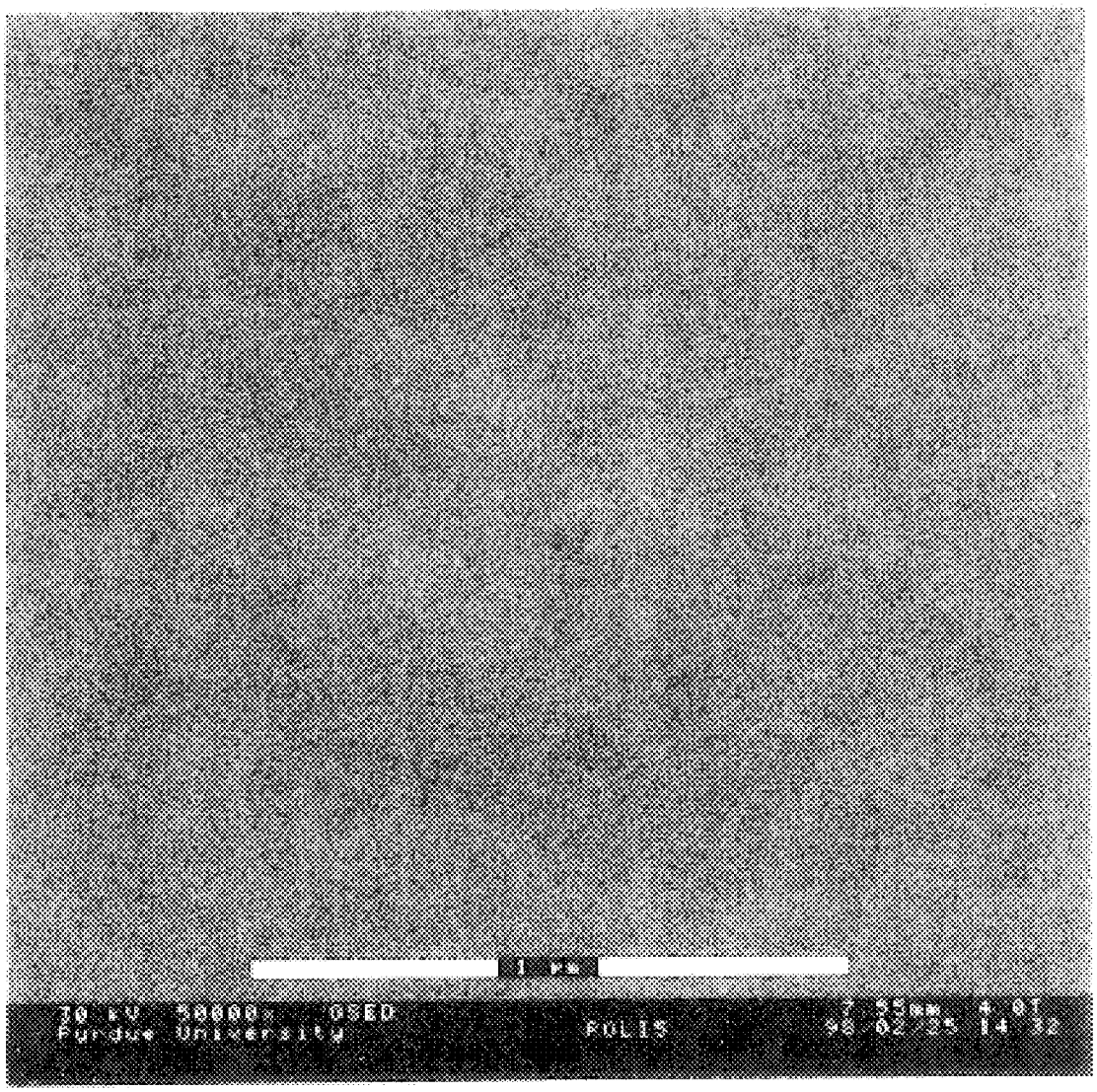
FIG. 1 shows a photomicrograph at 50,000 magnification of a 65 mm substrate of polycrystalline SiC showing an essentially pore free surface.

Each embodiment of the present invention provides a polycrystalline βSiC chip wafer substrate having a relatively featureless, non-porous silicon carbide ceramic surface substantially free of higher energy lattice positions. The non-porous silicon carbide ceramic surface covers an area of the substrate intended for use as a substrate to support additional layers comprising an electronic device. Thus, the usable surface of the component may not be its entire surface, so there could be areas of porous surface, defect-containing surface or even "through holes" in portions of the substrate.

βSIC ceramic wafer substrates made in accordance with the present invention are polycrystalline. Grain or crystal size is very small and predominantly oriented so that the {111} basal plane is substantially the only exposed crystallography on a wafer face for all practical purposes. A small minority (<5%) of the surface area of a SiC wafer face may not be oriented with the {111} surface exposed. The majority orientation of the wafer face, however, appears to predominate orientation of subsequent layers. The nearly amorphous nature of the material appears to encourage crystal cleavage along sympathetic planes. Polycrystalline βSiC ceramic wafer substrates can thus be made in very large diameters consistent with the most commonly used, SEMI standard sized wafers, e.g., 200 mm SEMI standard size wafer. Unlike single crystal SiC wafers, mechanical surfaces on polycrystalline βSiC wafers do not tend to expose "steps" or other high energy surface features because individual crystal size is very small. Polycrystalline βSiC wafers, therefore, do not require as fine a surface finish or as low a surface roughness as single crystal SiC wafers to reduce the numerical incidence of steps and other deleterious surface features.

Regardless of the ability to make large diameter wafers, a substrate must be able to support epitaxial thin film coatings in order to make high quality electronic devices. The inventor has discovered by means of extensive high angle and other X-ray diffraction analyses that silicon carbide, such as that described by U.S. Pat. No. 5,623,386, is highly oriented with the {111} basal plane exposed on the broad, flat surface which might be used as wafer. The {111} crystallography of the silicon carbide was always present in the material cited for disk drive components, but previously unknown. Though relatively insignificant with respect to the use of silicon carbide for disk drive components because of the different function of magnetic recording media as compared to thin films, the discovery of the crystallographic orientation is important for the use of the material as a chip wafer used to support epitaxial thin films used to make chips. In fact, silicon carbide used for magnetic recording devices or disk drive substrates can also be used to as ceramic chip wafer substrates to support thin film coatings comprising lower grade electronic devices. New and improved versions of the silicon carbide used for disk drive applications having reduced surface pore sizes with lower numerical incidence are useful as substrates or wafers for high quality electronic devices.

Figure 2:
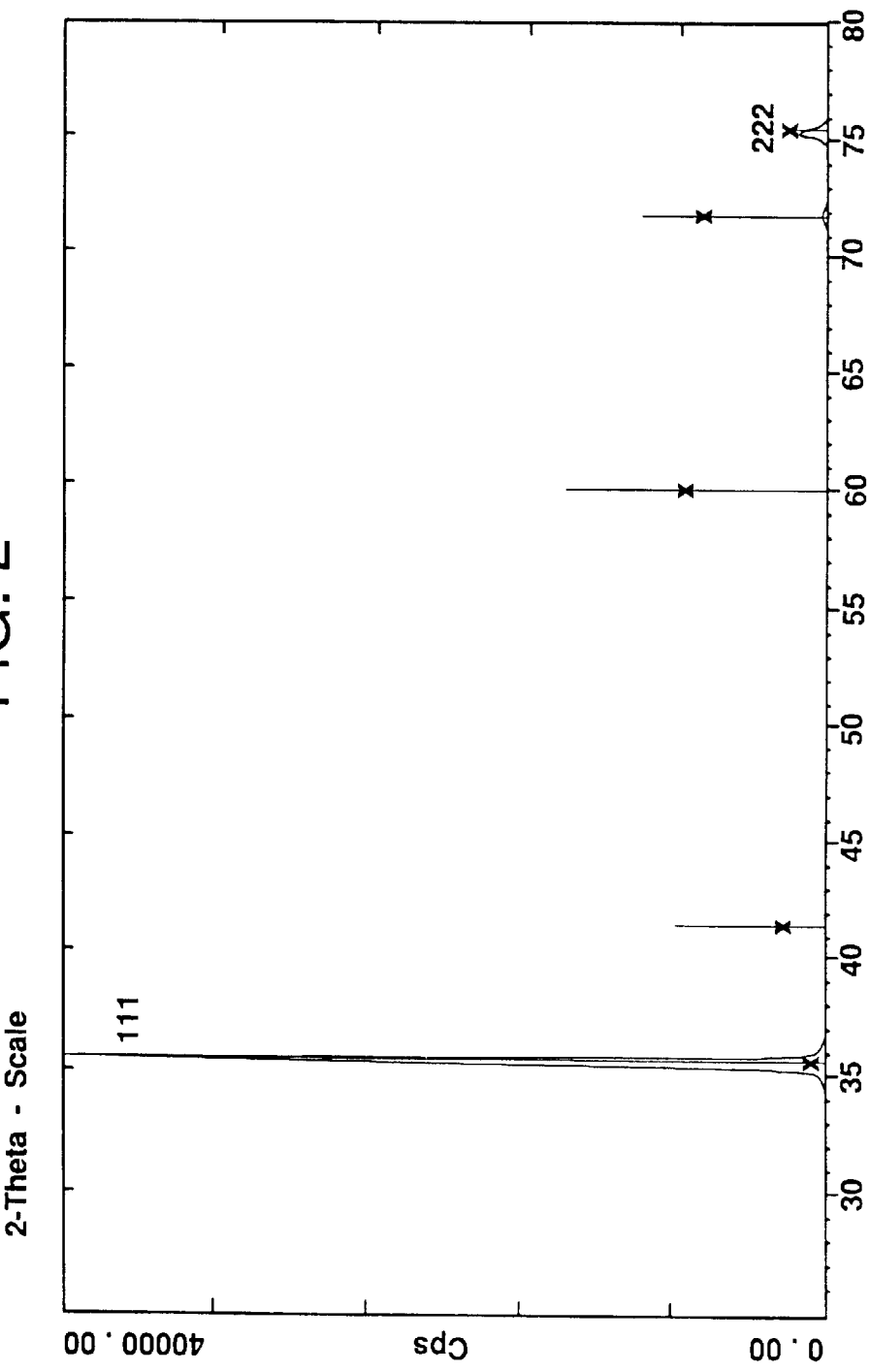
FIG. 2 shows an x-ray diffraction pattern of the substrate of FIG. 1 showing the {111} crystallography of βSiC as peak curves and crystallography patterns of αSiC as straight lines.

Polycrystalline silicon carbide ceramic monoliths, though comprised of multiple, tightly packed βSiC crystals, are oriented, uniform, and more compatible with βSiC epilayers than is single crystal αSiC. Numerous x-ray diffraction patterns taken from a single sample of a polycrystalline βSiC chip wafer substrate at different locations on that sample showed not a single basal plane other than {111} 3C βSiC. FIG. 2 is one such diffraction pattern showing individual βSiC crystals oriented with the {111} surface plane that would be exposed on the useful surface of a wafer substrate. FIG. 2 also shows the pattern for αSiC evidencing the different crystallography thereof. Surface energy of the βSiC substrate favors formation of a βSiC epilayer from a coating process conducive to βSiC.

Epitaxial thin films deposited on polycrystalline βSiC wafer substrates orient so that crystallography of the deposited thin film compliments the {111} surface plane of the substrate with respect to lattice parameter and coefficient of thermal expansion. The {111} surface of a βSiC thin film, for example, is formed adjacent to the individual {111} surfaces of a βSiC substrate. Both lattice parameter and coefficient of thermal expansion match almost perfectly. The epitaxial layer thus forms without stacking faults and associated dislocations. Other thin films having a crystallographic surface compatible with the {111} surface of βSiC will also orient in a manner comparable to a βSiC epilayer.

Like silicon, βSiC can be doped to form p-type and n-type semiconductor layers. Aluminum and boron dopants can be incorporated into βSiC thin films as partial pressures during the Chemical Vapor Deposition (CVD) process to form p-type layers. Likewise, nitrogen and phosphorus can be incorporated to form n-type layers.

Polycrystalline silicon carbide substrates also support electrically insulating, high dielectric strength thin films. Silicon monoxide, silicon dioxide, silicon nitride and beryllium oxide have high dielectric strength. Because silicon carbide substrates and silicon carbide semiconductors can withstand high temperatures, insulators and diffusion barriers can be applied at high deposition temperatures or can withstand high temperature annealing or ignition.

Temperatures of about 900–1000° C., for example, enable deposition of silicon nitride by CVD from the reaction of silane and ammonia with an almost ideal silicon-nitrogen ratio. The resulting film has a 9.4 dielectric constant and electrical conductivity of $10^{-13}$ to $10^{-14}$-ohm$^{-1}$–cm$^{-1}$. For another example, BeO deposited as an insulative film by reactive sputtering on a polycrystalline βSiC silicon carbide substrate can be "ignited" or annealed at high temperature to practically eliminate solubility in acids, solutions of fixed alkali hydroxides, or water. BeO has the highest thermal conductivity of all electrical insulators at >180 W/m ° K. at 100° C., electrical resistivity of >$10^{16}$ ohm-cm, and a 6.57 dielectric constant at 8.5 GHz.

Ferroelectrics and tantalum oxide thin films used to make capacitors and resistors also benefit from polycrystalline βSiC substrates. Barium ferrite, either with CoTi doping or without doping, in general having magnetoplumbite structure, for example, normally has a crystallization temperature of about 800° C., though processes using lower annealing temperatures of about 600° C. have been successfully used. Polycrystalline βSIC substrates are compatible with temperatures up to about 1100° C., high temperature ferroelectric thin films such as barium ferrite can be deposited at high temperature to make sure of maximum homogeneity with CoTi grain growth inhibiting dopants. Tantalum oxide can also be applied to polycrystalline βSiC substrates to form thin film capacitors and resistors at high deposition temperatures.

Polycrystalline βSiC wafers can be coated with very small metal lines that generate heat as electric current passes through the line. Silicon metal reacts with many metals and ceramic materials at elevated temperatures to form compounds such as silicides with different electrical properties than those intended. Polycrystalline βSiC wafers support devices that will operate for longer periods at higher temperatures than comparable devices formed on silicon wafers. Very small lines contribute materially to the enablement of smaller, more compact devices with more tools or features that operate at faster speeds and higher temperatures. Control devices operating energy consuming processes or equipment such as chemical processes, oil refineries, or automobiles, can be made to respond to input signals faster and thereby save energy.

Formed to "near-net-shape" rather than sawn from a single crystal, polycrystalline βSiC chip wafer substrate surfaces made in accordance with this invention can be lapped, polished, and etched to <0.18 μm site flatness on 25×32 mm sites surface roughness. The front side of polycrystalline βSiC chip wafer substrates can be polished in one or more steps to surface roughness measuring <5.0 Å Ra while the back side is typically finished to a lower standard with surface roughness measuring <20.0 Å Ra. Double-side polishing both front and back of a chip wafer is conducive to surface planarity. The surface finish and planarity of the front side of a chip wafer substrate governs, in part, the achievable resolution of circuit lines and other details of an electronic device formed thereon. A fine surface finish on the backside of a chip wafer substrate reduces the tendency of the chip wafer to "hold" contaminants.

Polycrystalline βSiC chip wafer substrates are formed as thin, flat "blanks," slightly thicker and larger in diameter for round substrates or longer sided for square substrates than the finished article. Polycrystalline βSiC substrates can be made larger than any standard substrates presently contemplated, including but not limited to 400 mm SEMI substrates. Though larger sized finishing tools are needed for large sized substrates, the process technology for polycrystalline is silicon carbide chip wafer substrates is not limited to making small, expensive silicon carbide substrates. Since it costs relatively the same to process a large diameter wafer as a small wafer, the cost of fabricating devices on wafers decreases in proportion to the surface area of the wafer. The trend in the chip industry is toward ever larger wafers to reduce costs. Unlike single crystal αSiC wafers, polycrystalline βSiC wafers can be made in very large sizes and therefore, devices can be fabricated on silicon carbide at very low cost.

Figure 3:
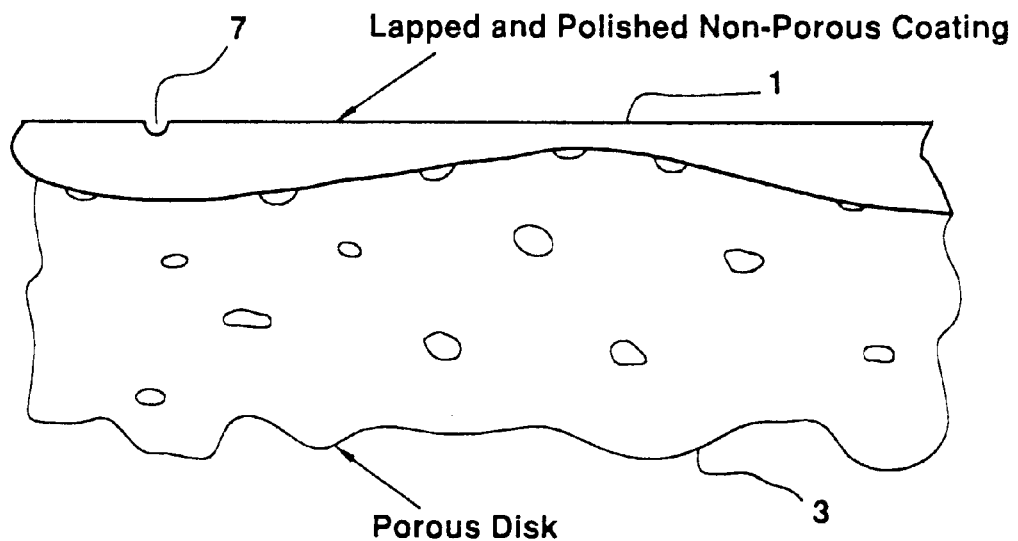
FIG. 3 shows a cross-sectional view of a polished substrate made in accordance with some of the embodiments of the present invention.

One embodiment of the present invention provides the aforesaid, relatively non-porous, silicon carbide ceramic surface 1 on a comparatively porous silicon carbide monolith 3 having pores 5 larger than the <0.1 μ pores 7 which might be tolerated on the surface of the substrate as in FIG. 3. Another embodiment provides a ceramic substrate with few pores, either internally or externally exposed, larger than 0.1 μ. The non-porous surface of FIG. 3 has utility in head applications, disk substrates, chip substrates and any other components disclosed herein.

Substrate materials used for disks and disk drive heads can also be used as substrates for less demanding chip wafer applications as long as the maxim pore size is significantly smaller than the line thickness of the electrical device As U.S. patent application Ser. No. 08/624,824 points out, "minimizing exposed pores (or other surface discontinuities) is important to prevent discontinuities in circuits printed on the surface." U.S. patent application Ser. No. 08/624,824 is incorporated into this application by reference. The inventor has recently discovered that improvements in process equipment cleanliness and raw material purity significantly reduce the number and size of surface defects. Reduction of surface defect size and numerical frequency, in turn, allows reducing line or features size to enable manufacture of high quality devices on polycrystalline βSiC wafers.

None of the preferred embodiments of the present invention utilize silicon metal to fill surface pores or to densify a porous ceramic monolith. Very small amounts of non-stoichiometric silicon metal or carbon are, however, common byproducts or coproducts of the making of silicon carbide ceramic by powder metallurgical, chemical vapor deposition, or supercritical fluid processing methods. Raw material purity and process equipment cleanliness are critical to the manufacture of polycrystalline βSiC wafers for high quality devices. While thermodynamics and the reactivity of chemical species govern crystal orientation and compound stoichiometry; impurities, whether from reactants or from process equipment, control pore size and the numerical incidence of pores in addition to occasional grain growth. Higher purity and cleanliness are always better. The level is largely determined by the requirements of the electrical device in terms of line size, line thickness, and thin film orientation. U.S. Pat. Nos. 4,239,819, 4,961,913, and 5,623,386 are incorporated into this application by reference. U.S. Pat. Nos. 4,239,819, 4,912,063 and 4,961,913 exemplify the methods as part of making the substrate disclosed in U.S. Pat. No. 5,623,386 and exemplify methods for the instant invention taking into account the disclosure above regarding purity and cleanliness.

Figure 4A:
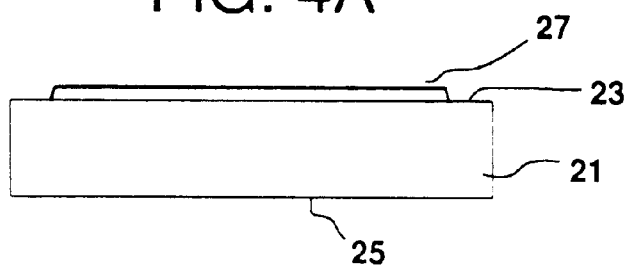
FIG. 4A shows the inventive wafer with a thin film coating thereon.

FIG. 4A shows a wafer 21 having a top surface 23 and a bottom surface 25. The wafer surface 23 is essentially pore free as defined above in terms of the absences of pores, depressions or the like having a dimension no greater than 2.54 micron, preferably less than 0.1 microns and the wafer is made of the silicon carbide as described above. The surface 23 has a thin film coating 27 thereon. The coating is shown covering only a portion of the entire surface 23 but total coverage of the surface 23 is within the scope of the invention. Often times, the thin film is applied and partially removed when making an integrated circuit or other electrical structure on a wafer, e.g., a transistor. Although one thin film is shown, a plurality could be applied on the wafer as part of the electrical component manufacture. Exemplary processing steps include applying a silicon nitride layer and partially etching or patterning it. A thermal oxide thin film can then be grown around the nitride followed by removal of the nitride layer. A gate oxide can then be grown followed by deposition of a polycrystalline silicon or silicon carbide. The polycrystalline silicon or silicon carbide is patterned and a self aligned etch of the exposed oxide takes place. The exposed silicon or silicon carbide is doped and reoxidation takes place. Contact windows are opened and a metal film is deposited and patterned so as to interconnect with one or more other devices on the substrate. A plurality of such devices can be formed as part of an integrated circuit.

Figure 4B:
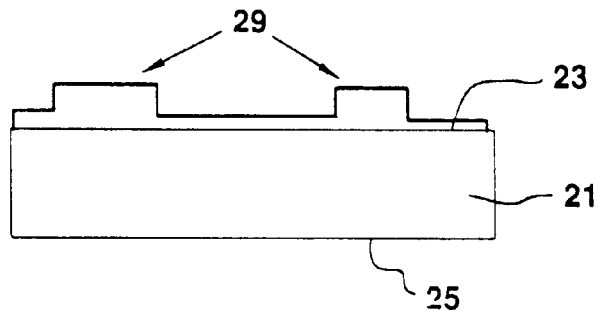
FIG. 4B shows a wafer and electronic devices in schematic form.

FIG. 4B shows a schematic representation of the wafer 21 and devices 29 which are intended to schematically represent a plurality of devices to form an integrated circuit. The devices 29 are intended to represent known or contemplated devices requiring a substrate for device support as part of an electrical component, e.g., an integrated circuit.

As such, an invention has been disclosed in terms of preferred embodiments thereof which fulfills each and every one of the objects of the present invention as set forth above and provides a new and improved substrate for particular use as a chip wafer.

Of course, various changes, modifications and alterations from the teachings of the present invention may be contemplated by those skilled in the art without departing from the intended spirit and scope thereof. It is intended that the present invention only be limited by the terms of the appended claims.

I claim:

1. A laminate comprising
   a) a chip wafer substrate component comprising a working surface, at least a portion of the working surface further comprising a polycrystalline beta silicon carbide outer surface with {111} crystallographic planes exposed on the working surface, without exposed pores, scratches, steps or other such depressions or discontinuities on the surface of the substrate having at least one dimension larger than 2.54 microns, and no non-stoichiometric silicon or carbon other than that which may be residual from the process of making silicon carbide ceramic material; and
   b) a non-magnetic thin film coating on the outer surface thereof.

2. The substrate of claim 1 wherein the substrate is finished to <5 Å Ra on the portion of the working surface and <20 Å Ra on a surface opposite the working surface.

3. The substrate of claim 1 wherein the substrate is finished to <0.4 microns Ra on both of the surfaces for use as a test wafer.

4. The substrate of claim 1, wherein the surface of the substrate is without exposed pores, scratches, steps, or other such depressions or discontinuities having at least one dimension larger than 0.1 micron.

5. The laminate of claim 1, wherein the thin film coating is selected from the group of a metallic material, an electrical insulating material, a ferroelectric material, a resistive material and a semiconductor material.

6. The laminate of claim 5, wherein the substrate is finished to <5 Å Ra on the portion of the working surface and <20 Å Ra on a surface opposite the working surface.

7. The laminate of claim 5, wherein the metallic material contains one of gold, aluminum, silver and copper.

8. The laminate of claim 5, wherein the electrical insulating material is one of silicon monoxide, silicon dioxide, beryllium oxide and silicon nitride.

9. The laminate of claim 5, wherein the ferroelectric material is one of tantalum dioxide, barium ferrite or perovskite.

10. The laminate of claim 5, wherein the semiconductor material is a doped βSiC epitaxial layer.

* * * * *